United States Patent [19]

Zajac

[11] 4,230,515
[45] Oct. 28, 1980

[54] PLASMA ETCHING APPARATUS

[75] Inventor: John Zajac, San Jose, Calif.

[73] Assignee: Davis & Wilder, Inc., Santa Clara, Calif.

[21] Appl. No.: 928,594

[22] Filed: Jul. 27, 1978

[51] Int. Cl.³ .................... C23F 1/02; H01L 21/306
[52] U.S. Cl. .............................. 156/345; 204/192 E; 204/298; 156/643
[58] Field of Search ............... 204/192 E, 298, 164; 156/345, 643, 646; 250/531

[56] References Cited

U.S. PATENT DOCUMENTS

| 4,094,722 | 6/1978 | Yamamoto et al. | 156/345 |
| 4,119,881 | 10/1978 | Calderon | 313/360 |
| 4,148,705 | 4/1979 | Battey et al. | 204/192 E |

OTHER PUBLICATIONS

H. M. Gartner et al., Achieving Uniform Etch Rates in Reactive Ion Plasma Etching Process, IBM Technical Disclosure Bulletin, vol. 20, No. 7, Dec. 1977, 2703.
H. M. Gartner et al., Selective Etch Rate Control Technique in Reactive Ion Etching, IBM Technical Disclosure Bulletin, vol. 21, No. 3, Aug. 1978, pp. 1032-1033.
A. Lanzaro, Individual Wafer Etch-Rate Control in Batch Reactor, IBM Technical Disclosure Bulletin, vol. 22, No. 3, Aug. 1979, pp. 1008-1009.
J. L. Vassen and W. Kern, Editors, Thin Film Processes, Academic Press, New York, 1978, pp. 507-512.

Primary Examiner—John H. Mack
Assistant Examiner—William Leader
Attorney, Agent, or Firm—Limbach, Limbach & Sutton

[57] ABSTRACT

An improvement in radial flow parallel plate plasma etchers has been developed in order to improve the uniformity of etching across the entire radial plate dimension. The improvement comprises radially decreasing the spacing between the electrodes wherein the gap between the electrodes is greatest at the center and smallest at the circumference of the electrodes.

9 Claims, 3 Drawing Figures

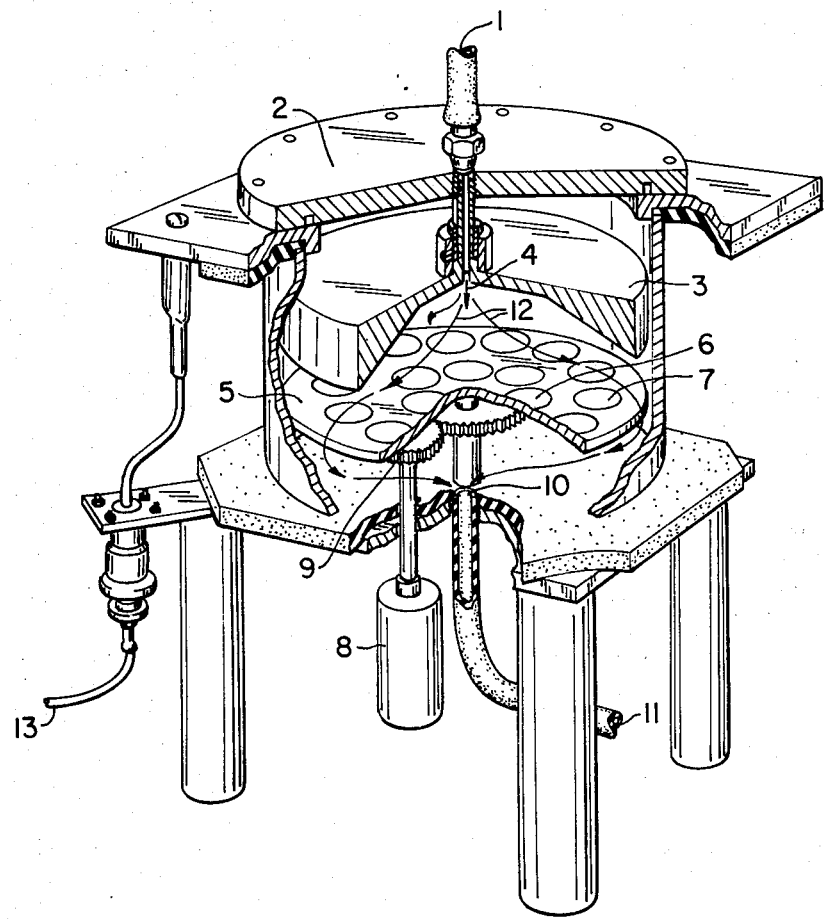
FIG._1.

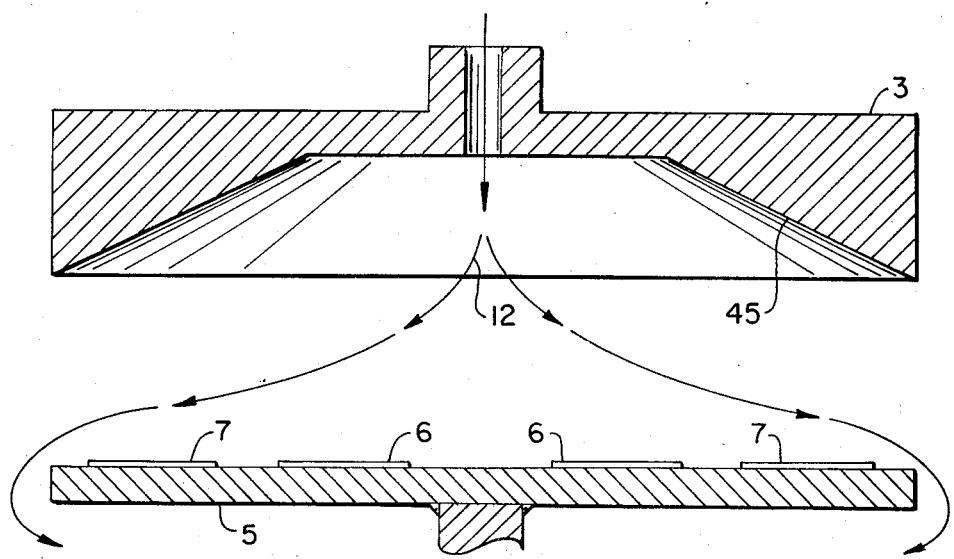
FIG._2.
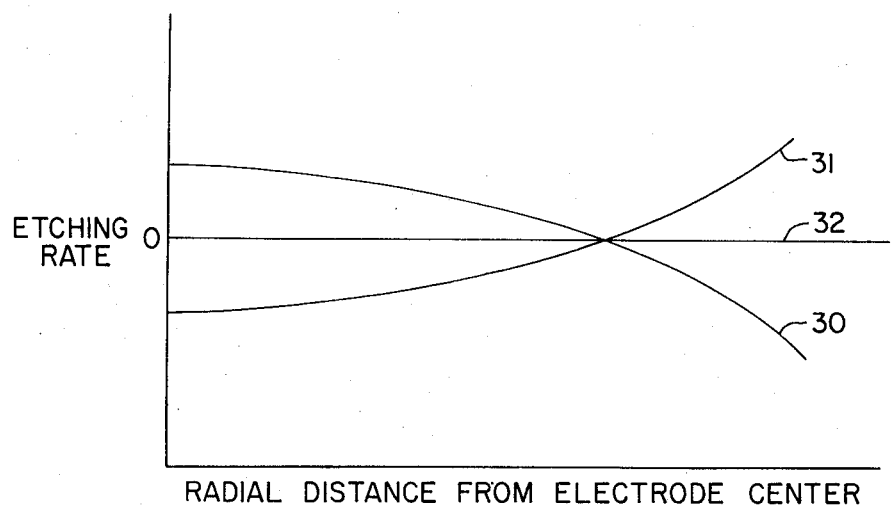
FIG._3.

PLASMA ETCHING APPARATUS

BACKGROUND OF THE INVENTION

The gas plasma vapor etching process has been utilized in the past for performing etching operations on semiconductor wafers by exposing the wafers to an active plasma to remove portions of materials carried by the semiconductor structure. The extension of reactive plasma etching beyond the patterning of silicon, silicon nitride and silicon oxide has greatly expanded the horizons of plasma etchings to include, among other things, the etching of aluminum in the production of small geometry integrated circuits. Plasma as compared to chemical etching produces better edge definition, less undercutting, considerably less photoresist adhesion sensitivity, and the elimination of so-called "knee breakdown" due to thinning of the photoresist at sharp edges. This thinning where the aluminum goes over and down the side wall of a cut leads to premature resist failure during wet etching, thus permitting removal of the metal at the near edge.

Although plasmas are not clearly understood, it is known that a special form of chemical materials can be made by exposing the compounds to high energy radio frequencies. Under the influence of these radio frequencies, compounds breakdown and rearrange to form transitory species with life spans so short that they are difficult to identify. Accordingly, unexpected reactions can be effected in a plasma that are difficult or impossible to effect using more conventional techniques. For example, a plasma of a very inert gas such as a fluorocarbon, known commercially as Freon, will etch glass, indicating that an active fluorine species is present in the plasma. In addition to the active chemical species, there are strong radiations, such as ultraviolet, and strong ion and electron bombardment of the surfaces within the plasma.

One of the great difficulties in plasma etching is the failure to achieve uniform etching of the wafer. As noted in U.S. Pat. No. 3,879,597, the edges of wafers are etched more deeply than the centers which results in a lack of uniformity of etching across individual wafers. This was partially remedied by employing slower etching rates, which cause less attack on the resist and by using greater spacing between the wafers. The referenced patent also employs a perforated inner chamber which partially prevents photoresist attack.

It has further been noted that beyond non-uniformity within each wafer, there remains a lack of etching uniformity from wafer to wafer wherein the etching rate decreases as the distance from the center of the circular electrode radially increases. As disclosed in an article entitled *PLASMA ETCHING OF ALUMINUM* by Herndon et al. at the M.I.T. Lincoln Laboratory, rotation of the wafer holder is carried out in order to "obtain consistent wafer-to-wafer and across-wafer etch times within a run and from run-to-run." It has been found, however, that even with wafer rotation, wafer-to-wafer etching rates vary causing uneven and unpredictable results in semiconductor fabrication.

SUMMARY OF THE INVENTION

It is thus an object of the present invention to improve the disadvantages outlined above.

It is another object of the present invention to carry out a plasma etching operation wherein all of the wafers are etched at a substantially constant rate, regardless of their placement within the plasma etching apparatus.

These and other objects of the present invention can be more fully appreciated when viewing the attached Figures wherein:

FIG. 1 is a perspective view of a plasma etching device,

FIG. 2 is a cross-sectional view of the electrode configuration according to the present invention, and FIG. 3 is a graphical depiction of the etching rate effect of the present invention.

Prior art radial flow parallel plate plasma etching devices traditionally have two circular electrodes, typically the top electrode being in a charged state and the bottom electrode being grounded. The material to be etched is generally in the form of wafers several inches in diameter which are placed upon the bottom electrode on a platen or holder. As a means of enhancing improved wafer etching, it has been traditional to feed the gas, which forms the plasma, from an opening in the center of the top electrode and allow the gas to radially pass over the wafers to be etched. The plasma is then collected from a point below the bottom electrode through a vacuum line. As stated previously, the lower electrode can also be rotated in order to improve wafer etching.

It has been found that the plasma charge density at or near the center of the circular electrode is much greater than the density at the radial extremities of the electrode plates. This results in a decrease in etching rates as the electrodes are traversed radially from their centers to the circumference. It was found that by modifying the traditional parallel plate radial flow plasma etcher such that the gap between the electrodes is decreased as one moves radially from the center to the circumference of the circular electrodes, the current charge density can be increased to compensate for the natural decrease in plasma density as the plasma gas moves from the center to the extremities of the electrode surface.

Turning now in more detail to FIG. 1, a perspective view of a parallel plate radial flow plasma etcher is shown wherein certain details which are of no importance in understanding the present invention have been eliminated. As depicted, wafers 6 and 7 to be etched are shown residing on lower electrode 5 which is designed to rotate via variable speed drive motor 8 and drive pinion 9.

Gas which will form the plasma enters through orifice 1 through top plate 2 and feeds into the etching chamber between the electrodes at 4. The gas passes through top electrode 3 and circulates as shown by arrows 12. Once the plasma has passed over wafers 6, 7, it is collected through orifice 10 via vacuum connection 11.

Viewing FIGS. 1 and 2 together, traditional parallel plate radial flow plasma etchers possess two electrodes which sandwich the wafers. Unlike traditional designs, top electrode 3 has been modified to possess a second outer area 45 which results in a reduced gap at the circumference of the circular electrodes as compared to the gap found at their centers. This increases the current density at and near the circumference of the electrodes over what the current density would be with completely parallel electrodes.

This improvement can be more fully appreciated when viewing FIG. 3, which is a graph of the etch rates of a wafer versus the radial distance from the electrode's center. Curve 30 shows the etch rate traditionally found with completely parallel electrodes. Line 30 shows a marked decrease in etching rates as one progresses from the center of the electrode radially toward the electrode's circumference.

Curve 31 depicts the effect of decreasing the gap between the electrodes without consideration given toward the decreased current density of a thinning plasma as one approaches the electrode's circumference. It can be seen by viewing curve 31 that the etch rates would normally increase with a decreased gap between the electrodes.

Straight line 32 represents the optimum situation wherein the etch rate is constant throughout the radial path of the electrodes. Line 32 represents the addition of the effects depicted in curves 30 and 31. Only by practicing the present invention, have constant etch rates been achieved over the entire radial distance of the electrodes.

The profile of the top electrode, and in particular surface 45, can either be straight or curved. The exact dimension of the top electrode is not readily predictable in advance of knowledge of other characteristics in the plasma etcher system. For example, the variance in electrode gap would depend on such factors as the identity and flow rate of the plasma, the size, placement and make-up of the wafers, the pressure within the chamber, the power generated between the electrodes and the speed of rotation of the bottom electrode.

EXAMPLE 1

Aluminum wafers, 3 inches in diameter, were placed in two circular rows on a 28-inch diameter lower electrode. Two top electrodes were prepared, a first of conventional form being completely planar and having a 28-inch outside diameter and a 10-inch inside diameter (see element 4 of FIG. 1). A second top electrode was prepared according to the present invention having identical outside and inside diameters as the previously prepared electrode, but being ¾ of an inch thicker at the circumference than at the center. The lower edge 45 (FIG. 2) of the top electrode increased in thickness in a linear fashion. The gap at the circumference was set at 1.67 inches. It was thus 2.42 inches at the center (1.67" + ¾").

The etch gas chosen was carbon tetrachloride which was fed into the plasma etching chamber at a pressure of 250 microns. A current of 3.5 amps. was fed to the top electrode and the lower electrode supporting the wafers was rotated at a speed of 3 rpm.

The gap of the prior art etcher having two completely planar electrodes was set at 1.67 inches. It was decided to carry out the plasma etching process until all of the wafers were etched one micron. It was found that the inside row of aluminum wafers etched to the desired thickness in 7 minutes, while the outside row took approximately 10 minutes to etch the desired one micron thickness. By employing the thickened electrode of the present invention, all wafers etched at an even rate; the one-micron etch taking 9 minutes.

EXAMPLE 2

The same electrode configuration as described in Example 1 was used in this example for the etching of polysilicon wafers in a 50–50 mixture of $SF_6$ and $N_2$ gas. It was found that with the conventional parallel plate planar system, the inside row etched one half micron 4 minutes while the outside row etched an equivalent amount in 5.5 minutes. By practicing the present invention wherein the gap at the circumference of the electrodes was 1.67 inches and the top electrode surface at the circumference was ½ inch closer to the surface of the bottom electrode than at its center, the wafers etched at an identical rate in 5 minutes.

In each example, a 40 cfm pump was used to evacuate the chamber and also draw off spent plasma. It was found that as the pumping speed was increased, the etching rate of the outside row of wafers increased slightly. More specifically, it was found that quadrupling the pumping speed increased the etch rate of the outside row approximately 10 percent as compared with the etch rate of the inside row. An increase in pressure tended to increase the etch rate at the radial outward part of the electrodes relative to the etch rate radially inwardly.

It was further found that increasing the power had the tendency to increase the etch rate of the inside row as compared to the outside row. Also, decreasing the gap size increased the relative etch rate of the outside row while the converse of increasing in gap size decreased the relative etch rate of the outside row was also true. For example, a ¼ inch change in gap size produced a noticeable variation in etch rates of approximately 5–10 percent.

The electrodes used to date have generally had a variation of ½ to ¾ of an inch between the gap at the circumference versus the center of the electrodes. Furthermore, a spacing of approximately 1.5 to 2 inches was traditionally employed to achieve the desired etch rates of approximately 1,000 angstroms per minute.

As can be seen from the above discussion, various parameters interact with one another in order to vary the respective etch rates of the wafers in order to most optimally produce an etch rate between wafers which is substantially constant. For example, if by thickening the top electrode at its circumference by ½ inch produces a substantially equal etch rate between rows but it is noted that the outside row is now etching slightly faster than the inside row, the pump speed can be slightly decreased. Similarly, the power can be slightly increased to thus increase the etch rate of the inside row. Although it was known that pump rate and power cause variations in etching rates, it was not appreciated, before the present application, that the gap between the top and bottom electrode could be varied along the electrode surface in order to achieve uniform etching over rows of wafers. In other words, applicants were the first to recognize the fact that the gap could be decreased as the circumference of the electrodes is approached such as to provide a substantially uniform field between the entire radial dimension between the electrodes.

What is claimed is:

1. In a radial flow plasma etcher having upper and lower spaced apart electrodes having substantially circular focus, the improvement comprising radially decreasing the spacing between the electrodes wherein the gap between the electrodes is greatest at the center and smallest at the circumference of the electrodes so as to improve the uniformity of etching.

2. The radial flow plasma etcher of claim 1 comprising means for introducing the gas forming the plasma from substantially the center of the upper electrode.

3. The radial flow plasma etcher of claim 1 comprising means for collecting the plasma from the center of the upper electrode.

4. The radial flow plasma etcher of claim 1 wherein the face of the lower electrode is substantially planar and the face of the top electrode radially slopes to provide for the decreasing gap between the electrodes at their circumferences.

5. The radial flow plasma etcher of claim 1 comprising means for introducing the gas forming the plasma from the center of the lower electrode.

6. The radial flow plasma etcher of claim 1 comprising means for collecting plasma from the center of the lower electrode.

7. In a radial flow plasma etcher having spaced apart upper and lower electrodes for the etching of wafers placed between the electrodes, said electrodes having substantially circular faces, the improvement comprising radially decreasing the spacing between the electrodes wherein the gap between the electrodes is greatest at the center and smallest at the circumference of the electrodes such as to provide substantially uniform etching of the wafers.

8. The radial flow plasma etcher of claim 7 wherein the lower electrode has a substantially planar face enabling the wafers which are to be etched to be placed thereon.

9. A plasma etch apparatus comprising:
a vacuum chamber,
a first electrode having a substantially circular face positioned within said chamber and having a first surface defining one side of a plasma etching region,
a second electrode having a substantially circular face positioned within said chamber and having a second surface defining the other side of the plasma etching region,
said first and second surfaces facing one another to define the plasma etching region therebetween,
said first and second surfaces shaped to provide a shorter distance therebetween adjacent their peripheries than inwardly from adjacent their peripheries so as to improve the uniformity of etching,
means for establishing an electrical potential difference between said electrodes, and
means for introducing gas into said vacuum chamber with the gas flowing between the portion of the plasma etching region adjacent the periphery of said first and second surfaces and the portion of the plasma etching region inwardly from the periphery of said surfaces to produce an etching plasma in the region between said first and second surfaces.

* * * * *